US009208838B2

(12) United States Patent
Peng

(10) Patent No.: US 9,208,838 B2
(45) Date of Patent: Dec. 8, 2015

(54) TERMINAL FOR ACCESSING WIRELESS NETWORK AND RUNNING METHOD THEREOF

(75) Inventor: Tao Peng, Shenzhen (CN)

(73) Assignee: ZTE CORPORATION (CN)

( * ) Notice: Subject to any disclaimer, the term of this patent is extended or adjusted under 35 U.S.C. 154(b) by 80 days.

(21) Appl. No.: 13/977,952

(22) PCT Filed: Jul. 5, 2011

(86) PCT No.: PCT/CN2011/076874
§ 371 (c)(1),
(2), (4) Date: Jul. 2, 2013

(87) PCT Pub. No.: WO2012/139336
PCT Pub. Date: Oct. 18, 2012

(65) Prior Publication Data
US 2014/0025878 A1 Jan. 23, 2014

(30) Foreign Application Priority Data

Apr. 15, 2011 (CN) .......................... 2011 1 0095488

(51) Int. Cl.
G11C 7/10 (2006.01)
G06F 9/445 (2006.01)
(52) U.S. Cl.
CPC .............. *G11C 7/1072* (2013.01); *G06F 8/665* (2013.01)
(58) Field of Classification Search
CPC ............... G06F 8/60; G06F 8/61; G06F 8/65; G06F 8/665; G11C 7/1072
See application file for complete search history.

(56) References Cited

U.S. PATENT DOCUMENTS

| 2004/0215816 | A1* | 10/2004 | Hayes et al. .................. 709/238 |
| 2005/0190393 | A1* | 9/2005 | Bledsoe et al. .............. 358/1.13 |
| 2010/0064056 | A1* | 3/2010 | Peng et al. .................... 709/236 |
| 2010/0122246 | A1* | 5/2010 | Gesquiere et al. ............ 717/173 |

FOREIGN PATENT DOCUMENTS

| CN | 1407480 A | 4/2003 |
| CN | 1472970 A | 2/2004 |

(Continued)

OTHER PUBLICATIONS

International Search Report for corresponding application PCT/CN2011/076874 filed May 7, 2011; Mail date Jan. 19, 2012.

(Continued)

*Primary Examiner* — Ernest Unelus
*Assistant Examiner* — Ronald Modo
(74) *Attorney, Agent, or Firm* — Cantor Colburn LLP

(57) ABSTRACT

Disclosed in the disclosure are a terminal for accessing a wireless network and a method for running the same, wherein the terminal includes an expanded external RAM and is configured to store the terminal firmware program obtained from the host side into the expanded external RAM, run the same and interact with the host side to complete a service. the terminal in the disclosure need not expand the FLASH storage space, and the terminal stores the terminal firmware program obtained from the host side into the expanded external RAM thereof, then runs the same and interacts with the host side to complete the service. The terminal does not use FLASH to store the terminal firmware program, avoiding the failure of not being able to be upgraded or used, wherein the failure is due to the exception of the terminal FLASH and reducing the costs of the wireless network access terminal.

10 Claims, 2 Drawing Sheets

(56) References Cited

FOREIGN PATENT DOCUMENTS

| CN | 10610604 | A | * | 12/2009 | ............ H04W 88/02 |
| CN | 101610604 | A | | 12/2009 | |
| CN | 101814034 | A | | 8/2010 | |
| WO | 9744946 | A1 | | 11/1997 | |

OTHER PUBLICATIONS

European Search Report for corresponding application EP 11 86 3626; Report dated Feb. 26, 2014.

* cited by examiner

| Instruction identifier | Data packet length | Data | Checksum value |
|---|---|---|---|

Fig. 2

| Response identifier | Data packet length | Instruction execution result | Checksum value |
|---|---|---|---|

Fig.3

TERMINAL FOR ACCESSING WIRELESS NETWORK AND RUNNING METHOD THEREOF

FIELD OF THE INVENTION

The disclosure relates to the technical field of wireless data communication, and particularly to a terminal for accessing a wireless network and a method for running the same.

BACKGROUND OF THE INVENTION

Terminals for accessing a wireless network include a wireless network module, a wireless network card, etc., which are widely applied net surfing media in the wireless wide area communication network currently. The working manner thereof is generally that the host side is connected to the terminal via physical interfaces such as universal serial bus (USB) interface and so on and exchanges data or AT commands to complete the basic telecom services.

The terminal itself has a digital baseband processor, which has to possess a firmware program if working. Currently, the terminal stores the firmware program into the expanded flash memory (FLASH) thereof, and when the terminal is powered up, the program will be read out from the FLASH and loaded into an expanded external random access memory (RAM) for running. When the firmware version is abnormal, the user has to reacquire a new firmware version and burn the same into the FLASH, and once the FLASH is ruined, it will cause the entire terminal not able to be upgraded or used.

SUMMARY OF THE INVENTION

The disclosure provides a terminal for accessing a wireless network and a method for running the same. The terminal does not use FLASH to store the terminal firmware program, thus failure of not being able to be upgraded or used due to any disfunction of the terminal FLASH can be avoided, and the cost of the terminal can be reduced.

In order to solve the above technical problem, the disclosure provides a terminal for accessing a wireless network and a method for running the same, the method comprises:

the terminal obtaining a terminal firmware program from a host side and storing the terminal firmware program into an expanded external Random Access Memory (RAM) of the terminal; and the terminal running the terminal firmware program and interacting with the host side to complete a service.

In an embodiment, before the terminal obtaining a terminal firmware program from a host side, the method further comprises:

the terminal obtaining a download proxy firmware program from the host side and storing the download proxy firmware program into an internal RAM of the terminal.

In an embodiment, the method further comprises: the download proxy firmware program enumerating a download port required by the terminal to obtain the terminal firmware program from the host side.

In an embodiment, before the terminal obtaining a terminal firmware program and storing the terminal firmware program into the expanded external RAM of the terminal, the method further comprises:

the host side sending a firmware data packet to the terminal via the download port; and the download proxy firmware program parsing to verify the firmware data packet, if it is accurate, then a response data packet will be fed back to the host side to identify that the firmware data packet is received successfully and downloading of the terminal firmware program will be started; otherwise, an error state data packet will be fed back to the host side to prompt the host side to resend the firmware data packet.

In an embodiment, before the host side sending a firmware data packet to the terminal via the download port, the method further comprises:

the host side sending a download start instruction data packet to the terminal via the download port; and the download proxy firmware program parsing to verify the download start instruction data packet, if it is accurate, then a response data packet will be fed back to the host side to identify that the download start instruction data packet is received successfully; otherwise, an error state data packet will be fed back to the host side to prompt the host side to resend the download start instruction data packet.

In an embodiment, after the download start instruction data packet is accurate, the method further comprises:

the host side sending a download address instruction data packet to the terminal via the download port, wherein the download address instruction data packet is for indicating an address for running the terminal firmware program in the external RAM; and the download proxy firmware program parsing to verify the download address instruction data packet, if it is accurate, then a response data packet will be fed back to the host side to identify that the download address instruction data packet is received successfully; otherwise, an error state data packet will be fed back to the host side to prompt the host side to resend the download address instruction data packet.

In an embodiment, after the terminal firmware program is obtained, the method further comprises:

the host side sending a download end instruction data packet to the terminal via a download port; and a download proxy firmware program parsing to verify the download end instruction data packet, if it is accurate, then a response data packet will be fed back to the host side to identify that the download end instruction data packet is received successfully and it is prepared to jump to the firmware ingress address of the terminal to run the terminal firmware program; otherwise, an error state data packet will be fed back to the host side to prompt the host side to resend the download end instruction data packet.

In an embodiment, the download start instruction data packet, the download address instruction data packet and the download end instruction data packet comprise: an instruction identifier, a data packet length, data and a checksum value, wherein the instruction identifier is for identifying an instruction type; and the response data packet comprises: a response identifier, a data packet length, an instruction execution result, and a checksum value.

In an embodiment, the download proxy firmware program parsing to verify the download start instruction data packet, the download address instruction data packet and the download end instruction data packet respectively comprises:

the download proxy firmware program calculating the checksum value of the data packet according to the length of the instruction data packet and comparing the checksum value of the data packet with the checksum value in the instruction data packet, if they are equal, then it is deemed that the received instruction data packet is accurate.

A terminal for accessing a wireless network comprises: an expanded external RAM and configured to store the terminal firmware program obtained from the host side into the expanded external RAM, run the terminal firmware program and interacts with the host side to complete a service.

Compared to the related art, the terminal in the disclosure does not need to expand the FLASH storage space, and the terminal stores the terminal firmware program obtained from the host side into the expanded external RAM thereof, then runs the same and interacts with the host side to complete the service. The terminal for accessing the wireless network in the disclosure does not use FLASH to store the terminal firmware program, thus the failure of not being able to be upgraded or used due to any disfunction of the FLASH can be avoided.

Furthermore, the terminal in the disclosure does not need to expand the FLASH storage space, and the terminal firmware program is directly downloaded into the RAM for running, thus hardware cost may be saved. At the same time, since the read/write operation of FLASH is not involved, the startup time of the terminal can be shortened.

BRIEF DESCRIPTION OF THE DRAWINGS

FIG. 2 is a schematic diagram of the format of an instruction data packet according to an embodiment of the disclosure; and FIG. 3 is a schematic diagram of the format of a response data packet according to an embodiment of the disclosure.

DETAILED DESCRIPTION OF EMBODIMENTS

Figure 1:
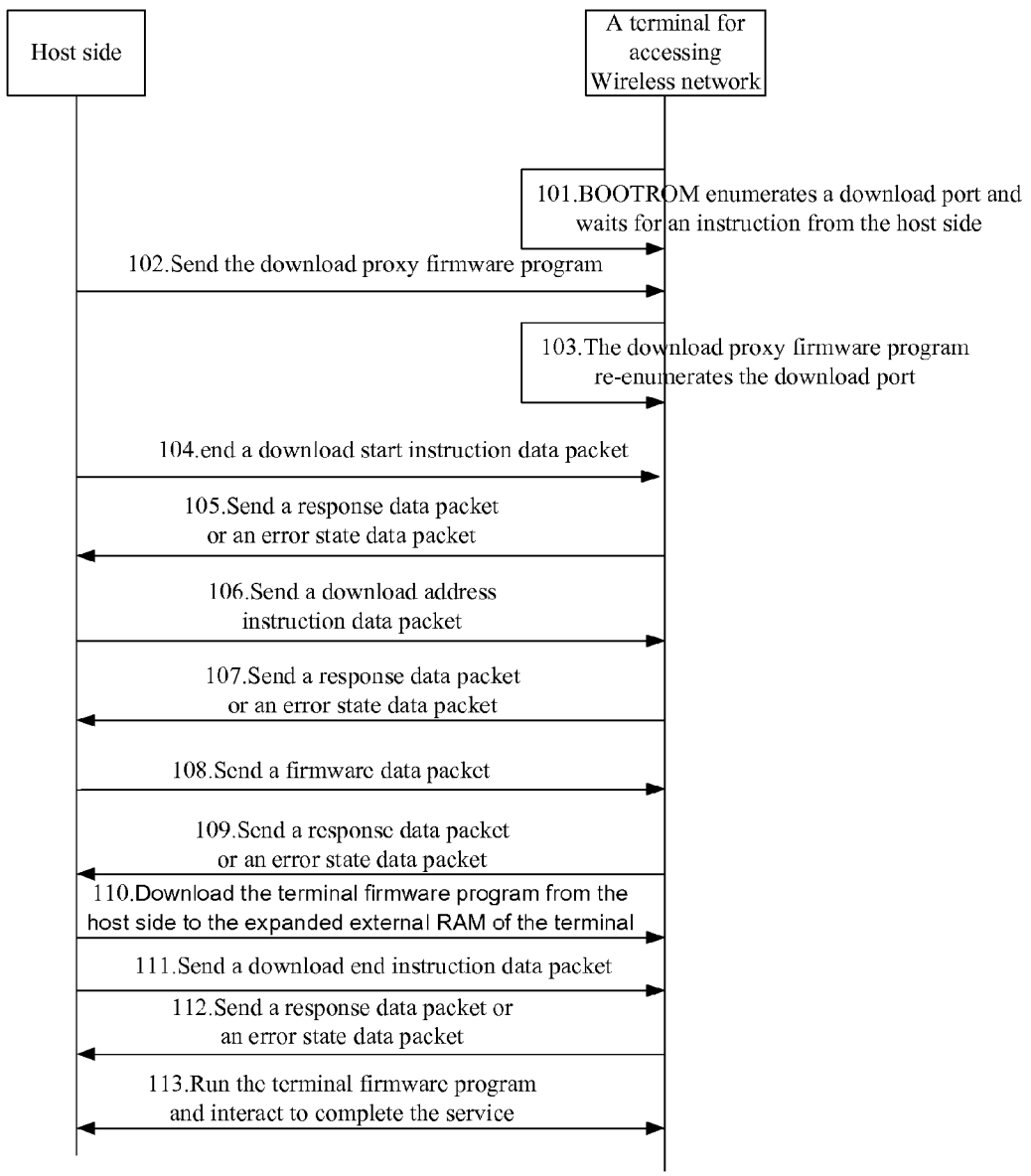
FIG. 1 is a flowchart of a method for running the terminal accessing a wireless network according to an embodiment of the disclosure.

Hereinafter, the disclosure will be further described in detail by way of particular embodiments in conjunction with the accompanying drawings.

Disclosed is a terminal for accessing the wireless network, and as compared to the conventional terminal for accessing the wireless network, the FLASH of the baseband processing chip does not need to be expanded for storing the terminal firmware program. The terminal in the disclosure needs to cooperate with the host to form a wireless access terminal. The terminal for accessing the wireless network includes an expanded external RAM and is configured to store the terminal firmware program obtained from the host side into the expanded external RAM thereof, run the same and interacts with the host side to complete a service.

The terminal for accessing the wireless network in the disclosure communicates with the host via a USB port. If the host is not installed with a host side program, then the host side program needs to be installed first, and the USB port drive will be installed together with the host side program.

The terminal for accessing the wireless network in the disclosure does not need to expand the FLASH storage space, and the terminal firmware program is directly downloaded into the RAM for running, thus hardware cost is saved. At the same time, since the read/write operation of FLASH is not involved, the startup time of the terminal can be shortened. The terminal does not use the FLASH to store the terminal firmware program, thus the failure of the terminal due to any disfunction of the FLASH can be avoided.

The terminal firmware program obtained by the terminal from the host side includes two situations: the terminal actively downloads the same from the host side and the host side pushes the terminal firmware program to the terminal. Hereinafter, the situation where the host side pushes the terminal firmware program to the terminal will be introduced particularly.

Please refer to FIG. 1. FIG. 1 is a flowchart of a method for running the terminal accessing a wireless network according to an embodiment of the disclosure, including the following steps:

Step 101, after the terminal for accessing the wireless network is powered up, the BOOTROM enumerates a download port and waits for an instruction from the host side.

Step 102, after detecting the download port, the host side sends the download proxy firmware program of the terminal to the terminal via the download port, and the BOOTROM stores the download proxy firmware program into the internal RAM of the terminal and jumps to the program ingress address for execution.

Step 103, the download proxy firmware program re-enumerates a download port.

Step 104, the host side sends a download start instruction data packet to the terminal via the download port.

Step 105, the download proxy firmware program parses to verify the download start instruction data packet, if it is accurate, then a response data packet will be fed back to the host side to identify that the download start instruction data packet is received successfully; otherwise, an error state data packet will be fed back to the host side to prompt the host side to resend the same.

Step 106, the host side sends a download address instruction data packet to the terminal via the download port, wherein the download address instruction data packet is for indicating an address for running the terminal firmware program in the external RAM.

Step 107, the download proxy firmware program parses to verify the download address instruction data packet, if it is accurate, then a response data packet will be fed back to the host side to identify that the download address instruction data packet is received successfully; otherwise, an error state data packet will be fed back to the host side to prompt the host side to resend the same.

Step 108, the host side sends a firmware data packet to the terminal via the download port.

Step 109, the download proxy firmware program parses to verify the firmware data packet, if it is accurate, then a response data packet will be fed back to the host side to identify that the firmware data packet is received successfully and the terminal firmware program will be started to download; otherwise, an error state data packet will be fed back to the host side to prompt the host side to resend the same.

Step 110, the terminal downloads the terminal firmware program from the host side to the expanded external RAM of the terminal.

Step 111, the host side sends a download end instruction data packet to the terminal via the download port.

Step 112, the download proxy firmware program parses to verify the download end instruction data packet, if it is accurate, then a response data packet will be fed back to the host side to identify that the download end instruction data packet is received successfully and it is prepared to jump to the firmware ingress address of the terminal to run the terminal firmware program; otherwise, an error state data packet will be fed back to the host side to prompt the host side to resend the same; and Step 113, the terminal runs the terminal firmware program and interacts with the host side to complete a service.

Please refer to FIG. 2 and FIG. 3. FIG. 2 is a schematic diagram of the format of an instruction data packet according to an embodiment of the disclosure. FIG. 3 is a schematic diagram of the format of a response data packet according to an embodiment of the disclosure.

It can be seen from FIG. 2 and FIG. 3 that the instruction data packet such as the above download start instruction data packet, download address instruction data packet and download end instruction data packet and so on may include: an instruction identifier, a data packet length, data and a checksum value, wherein the instruction identifier is for identifying an instruction type, with the length thereof being 1 byte, the data packet length is 2 bytes, the length of the data is n bytes, and the length of the checksum value is 1 byte; the response data packet includes: a response identifier, a data packet length, an instruction execution result, and a checksum value, wherein the length of the response identifier is 1 byte, the length of the data packet length is 2 bytes, the length of the instruction execution result is 4 bytes, and the length of the checksum value is 1 byte.

In the embodiment, after receiving the instruction data packet sent by the host side, the download proxy firmware program reads the second byte and the third byte of this instruction data packet, i.e. data packet length, to obtain the length of the data packet, calculate the checksum of the data packet, then compare the same with the checksum value carried in the instruction data packet, and if they are equal, then a response data packet will be replied to the host side to identify that the instruction data packet is received successfully. Otherwise, an error state data packet will be replied to the host side to prompt the host side to resend the same. The total length of the response data packet sent by the download proxy firmware program to the host side is 8 bytes, and the response identifier is for identifying whether or not this is an instruction response data packet.

The above is a further detailed description of the disclosure in conjunction with particular embodiments, and the particular embodiments of the disclosure shall not be deemed as being limited to such description. Several simple deductions or replacements made by those skilled in the art without departing from the concept of the disclosure shall be viewed as belonging to the scope of protection of the disclosure.

What is claimed is:

1. A method for running a terminal for accessing a wireless network, comprising:
    the terminal obtaining a terminal firmware program from a host side and storing the terminal firmware program into an expanded external Random Access Memory (RAM) of the terminal; and
    the terminal running the terminal firmware program and interacting with the host side to complete a service;
    wherein before the terminal obtaining a terminal firmware program from a host side, the method further comprises:
    the terminal obtaining a download proxy firmware program from the host side and storing the download proxy firmware program into an internal RAM of the terminal, and
    the download proxy firmware program enumerating a download port required by the terminal to obtain the terminal firmware program from the host side.

2. The method according to claim 1, wherein before the terminal obtaining a terminal firmware program and storing the terminal firmware program
    into the expanded external RAM of the terminal, the method further comprises:
    the host side sending a firmware data packet to the terminal via the download port; and
    the download proxy firmware program parsing to verify the firmware data packet, if it is accurate, then a response data packet will be fed back to the host side to identify that the firmware data packet is received successfully and downloading of the terminal firmware program will be started; otherwise, an error state data packet will be fed back to the host side to prompt the host side to resend the firmware data packet.

3. The method according to claim 2, wherein before the host side sending a firmware data packet to the terminal via the download port, the method further comprises:
    the host side sending a download start instruction data packet to the terminal via the download port; and
    the download proxy firmware program parsing to verify the download start instruction data packet, if it is accurate, then a response data packet will be fed back to the host side to identify that the download start instruction data packet is received successfully; otherwise, an error state data packet will be fed back to the host side to prompt the host side to resend the download start instruction data packet.

4. The method according to claim 3, wherein after the download start instruction data packet is accurate, the method further comprises:
    the host side sending a download address instruction data packet to the terminal via the download port, wherein the download address instruction data packet is for indicating an address for running the terminal firmware program in the external RAM; and
    the download proxy firmware program parsing to verify the download address instruction data packet, if it is accurate, then a response data packet will be fed back to the host side to identify that the download address instruction data packet is received successfully; otherwise, an error state data packet will be fed back to the host side to prompt the host side to resend the download address instruction data packet.

5. The method according to claims 4, wherein the download start instruction data packet, the download address instruction data packet and the download end instruction data packet comprise: an instruction identifier, a data packet length, data and a checksum value, wherein the instruction identifier is for identifying an instruction type; and the response data packet comprises: a response identifier, a data packet length, an instruction execution result, and a checksum value.

6. The method according to claims 3, wherein the download start instruction data packet, the download address instruction data packet and the download end instruction data packet comprise: an instruction identifier, a data packet length, data and a checksum value, wherein the instruction identifier is for identifying an instruction type; and the response data packet comprises: a response identifier, a data packet length, an instruction execution result, and a checksum value.

7. The method according to claim 6, wherein the download proxy firmware program parsing to verify the download start instruction data packet, the download address instruction data packet and the download end instruction data packet respectively comprises:
    the download proxy firmware program calculating the checksum value of the data packet according to the length of the instruction data packet and comparing the checksum value of the data packet with the checksum value in the instruction data packet, if they are equal, then it is deemed that the received instruction data packet is accurate.

8. The method according to claim 1, wherein after the terminal firmware program is obtained, the method further comprises:

the host side sending a download end instruction data packet to the terminal via a download port; and a download proxy firmware program parsing to verify the download end instruction data packet, if it is accurate, then a response data packet will be fed back to the host side to identify that the download end instruction data packet is received successfully and it is prepared to jump to the firmware ingress address of the terminal to run the terminal firmware program; otherwise, an error state data packet will be fed back to the host side to prompt the host side to resend the download end instruction data packet.

9. The method according to claims 8, wherein a download start instruction data packet, a download address instruction data packet and a download end instruction data packet comprise: an instruction identifier, a data packet length, data and a checksum value, wherein the instruction identifier is for identifying an instruction type; and the response data packet comprises: a response identifier, a data packet length, an instruction execution result, and a checksum value.

10. A terminal for accessing a wireless network, wherein the terminal comprises an expanded external Random Access Memory (RAM) and is configured to store the terminal firmware program obtained from the host side into the expanded external RAM, run the terminal firmware program and interact with the host side to complete a service, obtain a download proxy firmware program from the host side and store the download proxy firmware program into an internal RAM of the terminal, the download proxy firmware program enumerating a download port required by the terminal to obtain the terminal firmware program from the host side.

* * * * *